United States Patent [19]
Lorieux

[11] Patent Number: 4,538,118
[45] Date of Patent: Aug. 27, 1985

[54] TRANSISTOR AMPLIFIER OPERATING AT ULTRA HIGH FREQUENCY UNDER PULSE OPERATING CONDITIONS

[75] Inventor: Roland Lorieux, Paris, France

[73] Assignee: Thomson CSF, Paris, France

[21] Appl. No.: 414,372

[22] PCT Filed: May 18, 1982

[86] PCT No.: PCT/FR82/00083
§ 371 Date: Aug. 27, 1982
§ 102(e) Date: Aug. 27, 1982

[87] PCT Pub. No.: WO82/04166
PCT Pub. Date: Nov. 25, 1982

[30] Foreign Application Priority Data
May 22, 1981 [FR] France ............................... 81 10255

[51] Int. Cl.³ ............................................. H03F 3/60
[52] U.S. Cl. ...................................... 330/286; 330/296
[58] Field of Search ................ 330/76, 286, 296, 267, 330/273

[56] References Cited
U.S. PATENT DOCUMENTS
3,562,557  2/1971  Gates .................................. 307/255

Primary Examiner—James B. Mullins
Assistant Examiner—G. Wan
Attorney, Agent, or Firm—Cushman, Darby & Cushman

[57] ABSTRACT

A pulsed transistor amplifier operating under transitory operating conditions at ultra high frequency, enabled as rapidly as possible, comprises capacitive means connected directly at the terminals of the transistor between emitter and collector when the transistor has its base to ground.

In the case where the amplifier comprises two push-pull connected transistors, two capacitors are provided and one is connected between the emitter of one transistor and the collector of the other.

6 Claims, 11 Drawing Figures

FIG_1 (PRIOR ART)
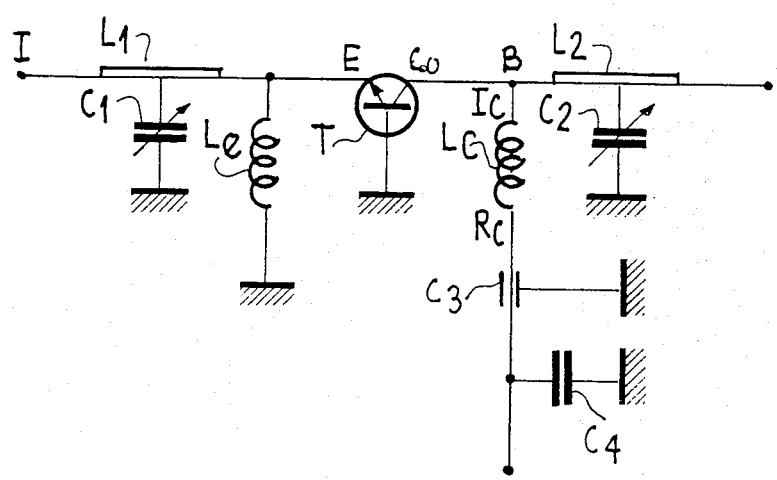
FIG_2
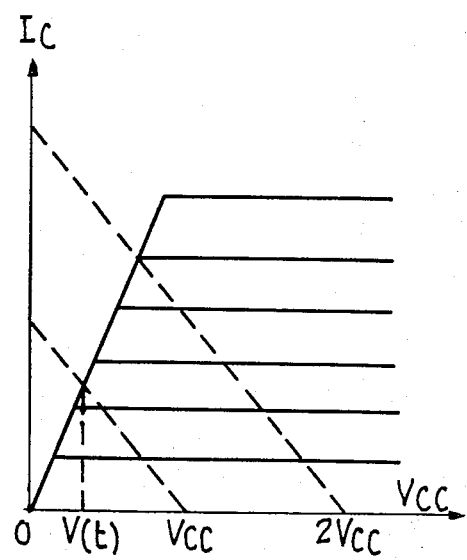
FIG_3
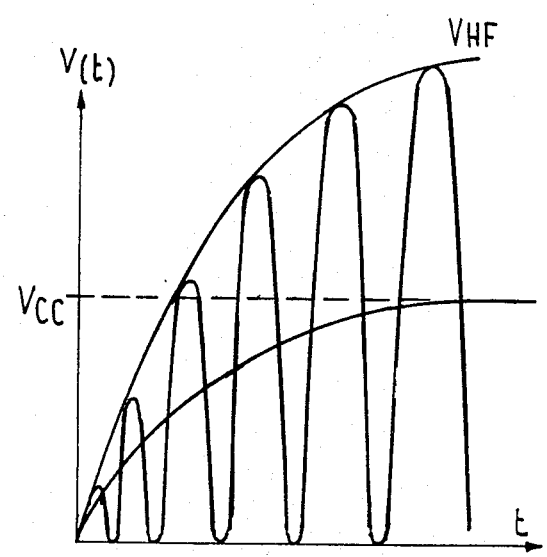

FIG_4
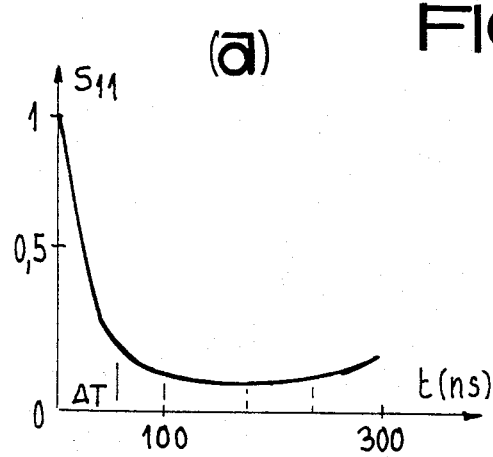
(a)
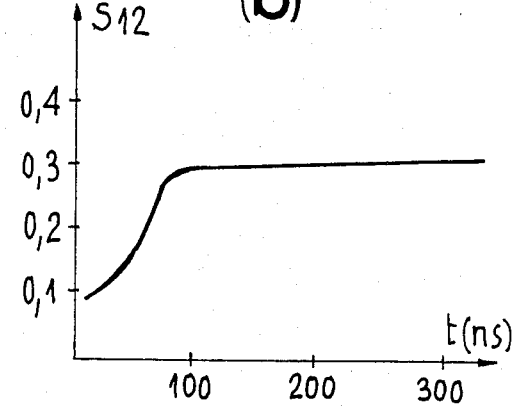
(b)
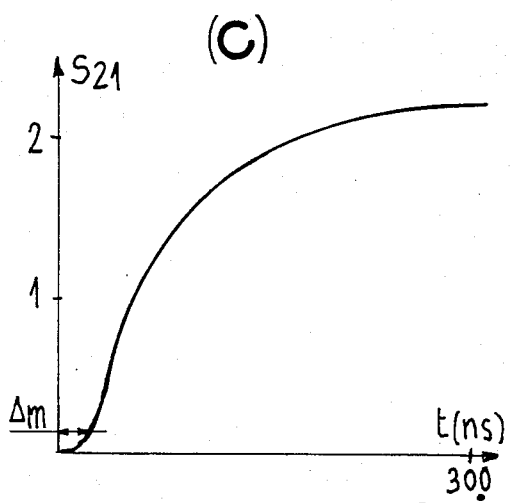
(c)
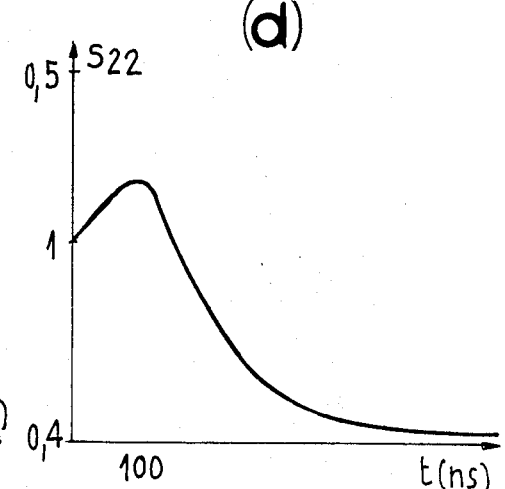
(d)
FIG_5
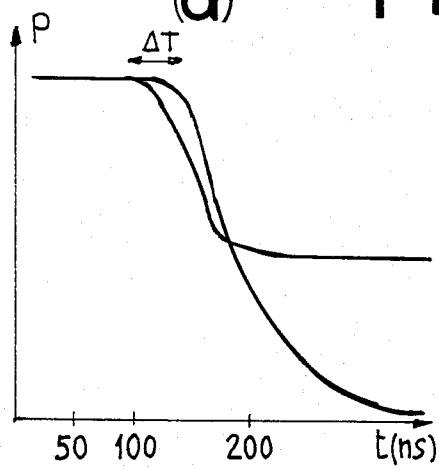
(a)
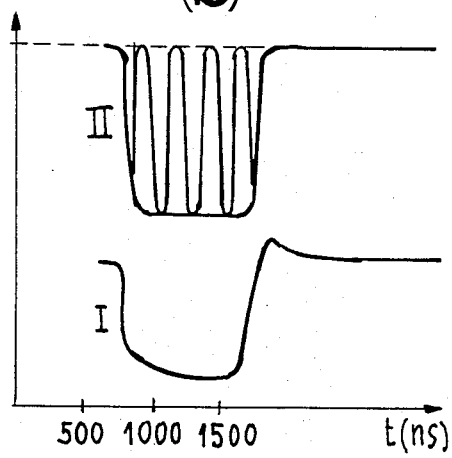
(b)

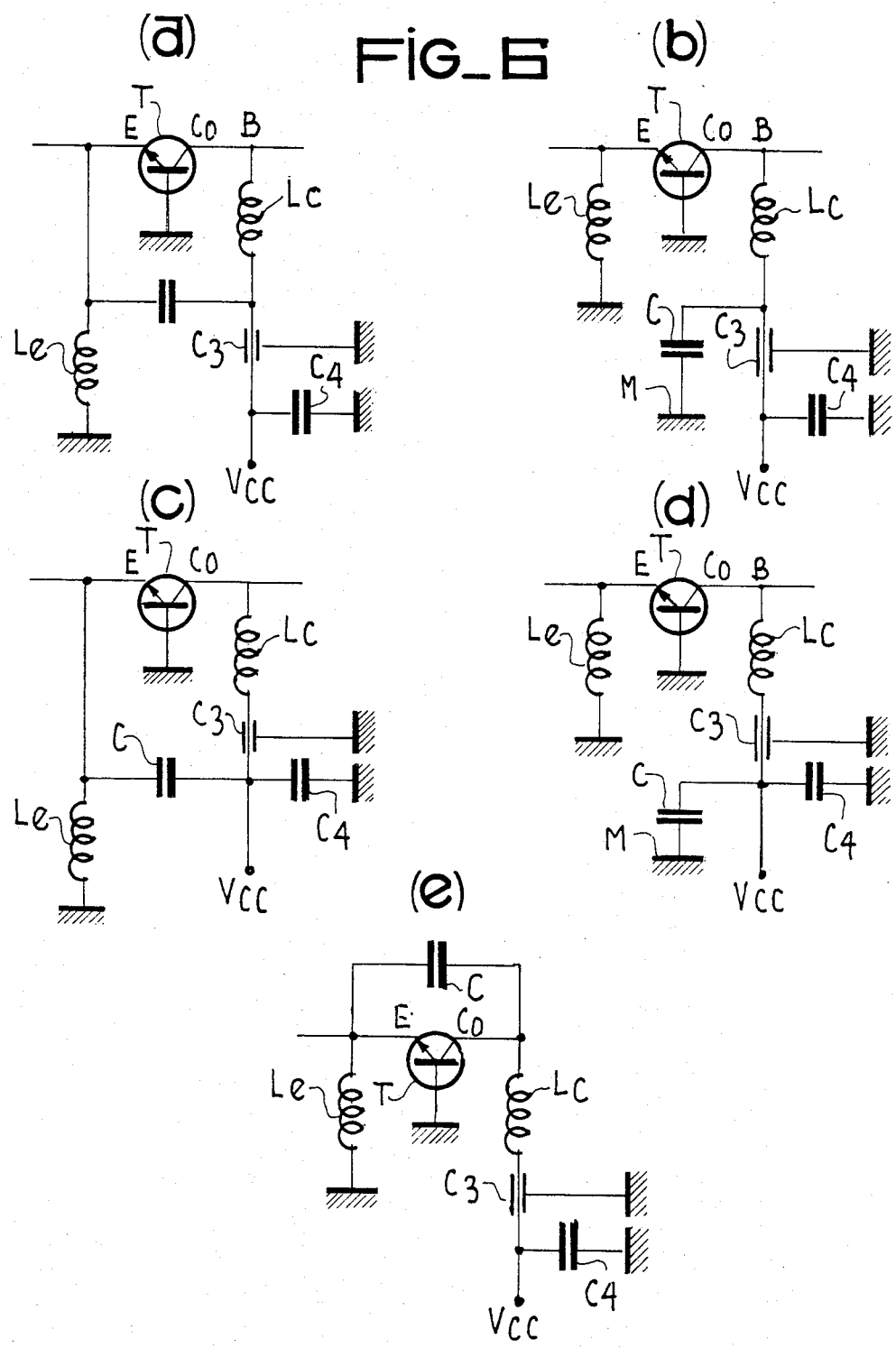

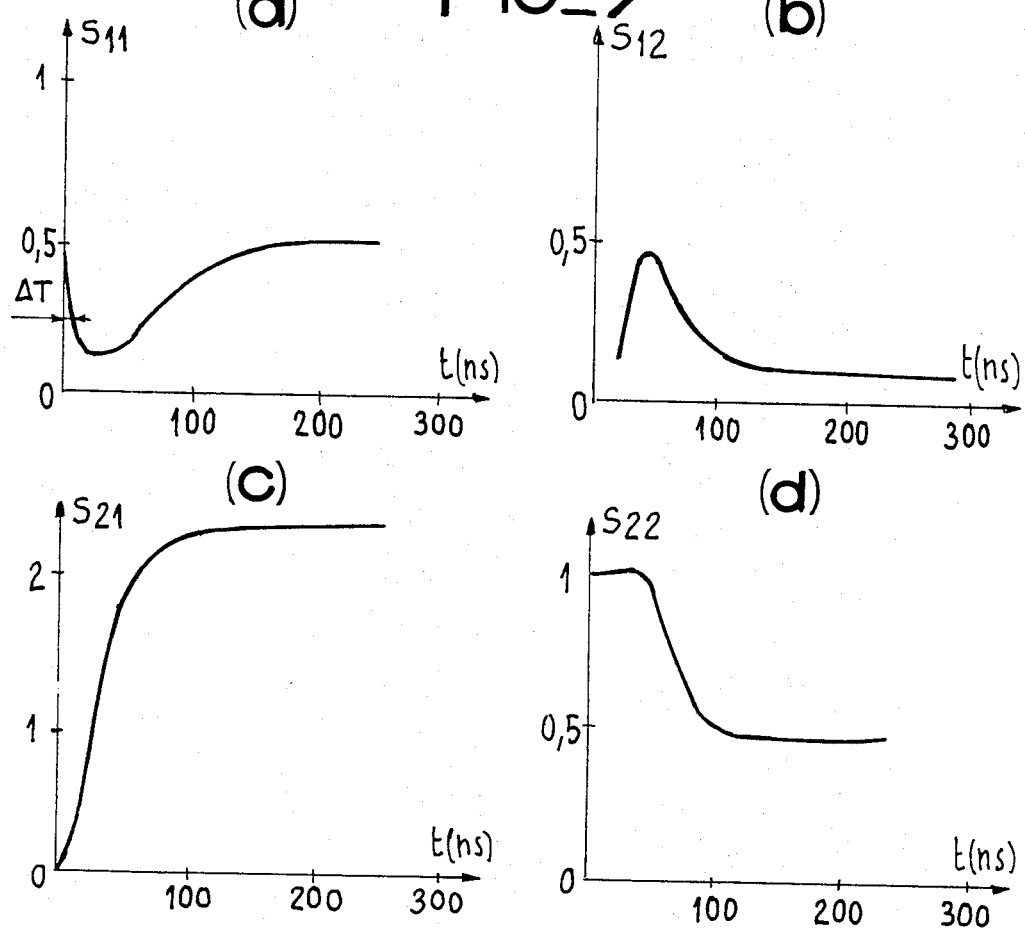
FIG_7
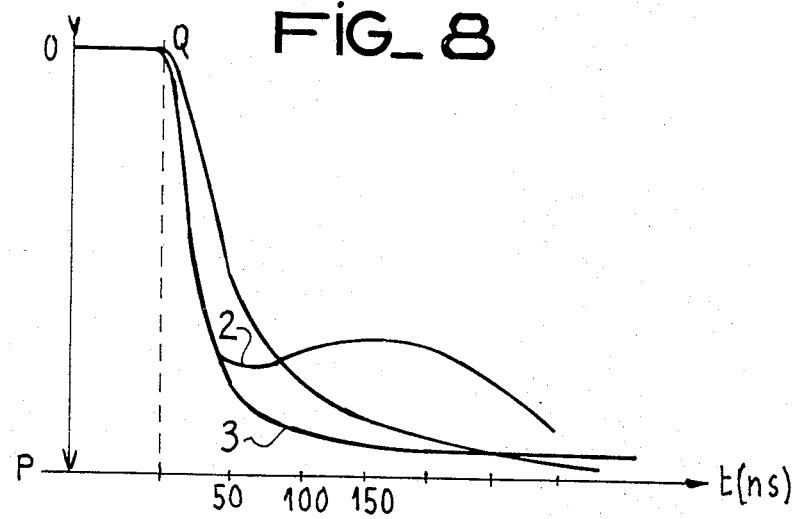
FIG_8

FIG_9
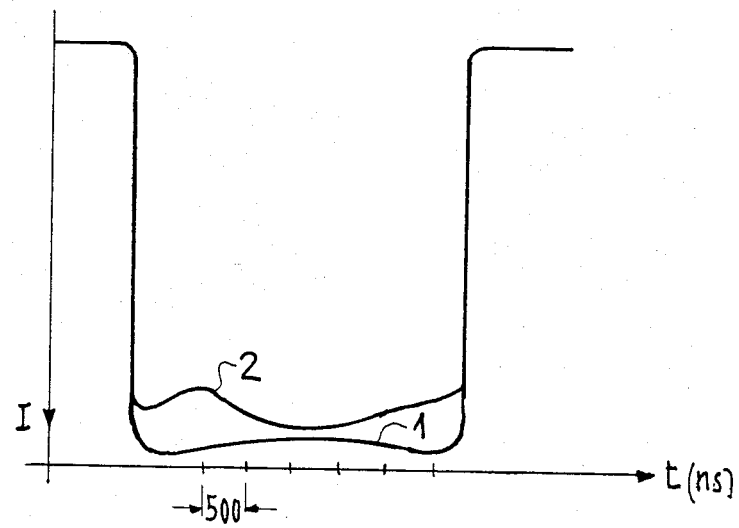
FIG_10-a
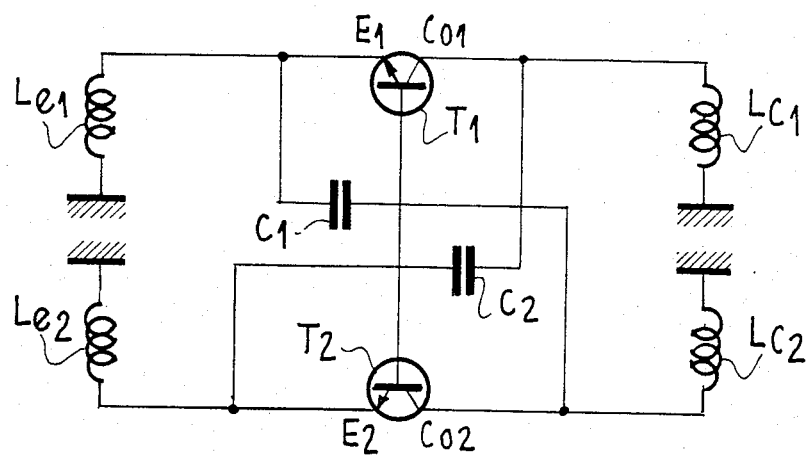

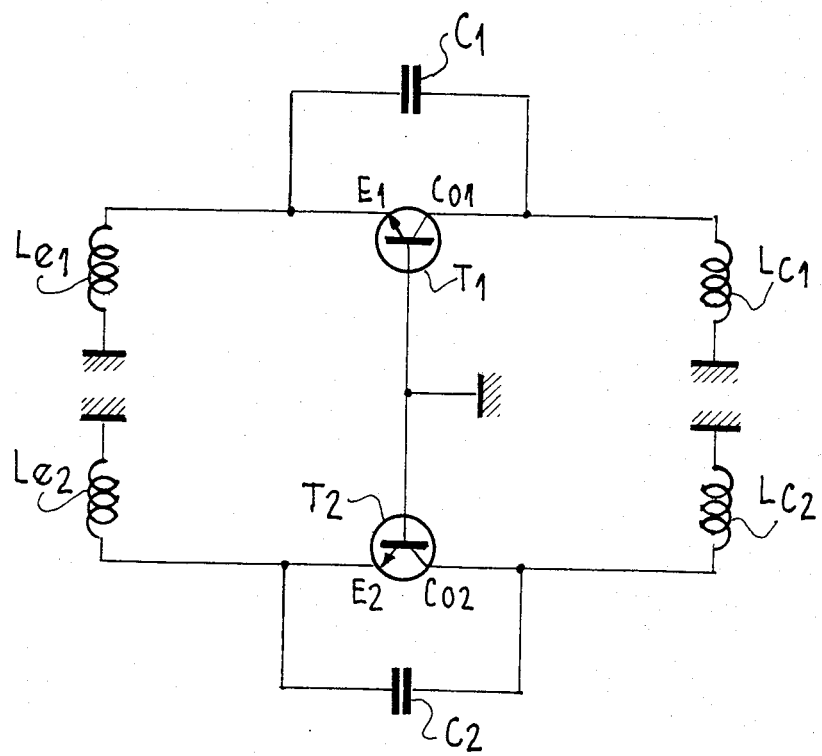
FIG_10-b

TRANSISTOR AMPLIFIER OPERATING AT ULTRA HIGH FREQUENCY UNDER PULSE OPERATING CONDITIONS

BACKGROUND OF THE INVENTION

The present invention relates to a transistor amplifier for ultra high frequency operation and more particularly to an amplifier for pulse operation. In this case and principally when the transistor is a high power transistor, the time required for establishing the current is not inconsiderable and in some applications, relative to radar, lengthening of the rise time of the output pulses of the amplifier causes errors in the distance measurements, in particular.

A state of the art of a transistor amplifier for high frequency operation may be formed by U.S. Pat. No. 3,919,656 filed on Apr. 23, 1973.

FIG. 1 of the present application represents a high frequency transistor amplifier similar to the one in the cited American patent, differing only in that the transistor T is connected with base to ground and not with common emitter. It operates in class B, i.e. without biassing voltage. Its emitter E is connected to the input of device I by means of an assembly L1 C1, inductance, capacitance and a socalled input inductance Le is placed in parallel across the base of transistor T. The collector of the transistor is connected to the output of the device by means of an assembly L2 C2. The power supply comes from a source VCC which applies a current Ic to the collector of the transistor through an inductance Lc after being enabled by the input pulse. A chemical capacitor C4 of high value serves as an energy reservoir when the current Ic is called for. The capacitor C3 is a decoupling capacitor for the high frequency.

Used with pulses, such a circuit has drawbacks under transitory operating conditions. In this case, in fact, the sudden conduction of the enabled transistor through appearance of the input pulse causes a high current drain through the inductance L1 connected between the input of the amplifier and the emitter of transistor T. The supply current then varies according to an exponential law whose time constant is proportional to the inductance components Lc and Le included in the circuit for supplying the transistor T with DC current. FIG. 2 shows the evolution of the supply current Ic as a function of the voltage VCE between collector and emitter. FIG. 3 shows the evolution of the high frequency voltage outputted as a function of time from the time when the input pulse is applied. It can be seen that the voltage applied to the collector increases progressively with an asymptote formed by the value of the VCC supply source and that the envelope of the high frequency voltage pulses has an exponential shape, in other words that the rising fronts are delayed. The ideal would be that the VCC voltage is reached in a minimum of time.

To remedy this drawback, attempts have been made to reduce the inductances Le and Lc, but limits are placed on this action by the input and output impedances of the transistor which impose a value below which the inductances Le and Lc cannot be lowered without short-circuiting the high frequency signals. Now, the effect of these inductances Le and Lc proves to be all the more pronounced the higher the value of the HF current peaks, which is the case for power transistors. It is thus apparent that the time for establishing the current in a power transistor cannot be reduced sufficiently when the inductances Le and Lc are reduced.

Another phenomenon related to the preceding one is due to the time required for causing conduction of the transistor for which the appearance of the nominal output power can only begin when the collector current has reached its average value i.e.

$$Ic = VCC/Rc,$$

VCC being the supply voltage and Rc the load resistance.

By studying the S parameters of the transistor which will be recalled below, the limits of its operation can be understood:

the parameter S11 represents the input coefficient of the amplifier, parameter S22 represents the reflection coefficient at the output, parameters S21 and S12 represent the transmission coefficients, respectively in the input to output direction and output to input direction; parameter S21 is the gain of the transistor in the usual meaning of the term.

FIGS. 4a to 4d show a graphic representation of these different coefficients. It can be seen, by examining curve S11 = f(t), FIG. 4a, that the reflected energy remains high during the first 50 nanoseconds, i.e. that the transistor is only enabled after a certain lapse of time. The energy transmitted remains low and the gain is less than unity, FIG. 4c. Matching and the transmitted power become correct after about 200 ns.

FIG. 5a, which shows the transmitted power as a function of time, shows (curve 1) that the power is applied at the input well before the output power appears (curve 0), time Δt being the enabling time of the transistor. FIG. 5b shows the form of the input pulse (curve I), the transistor absorbs current before the output power appears (curve II).

As was mentioned above, the principal cause of the observed disadvantages resides in the inductance parts of the supply circuit which can never be quite cancelled out. Attempts have been made to partly reduce this defect by placing a chemical capacitor C4 of high value in parallel across the supply just before the collector inductance Lc. This capacitor is referenced C4 in FIG. 1 and effectively it masks the inductive and resistive components situated upstream, i.e. on the supply side, but since it is of high value it also ensures the supply of energy for the transistor during the periods of high current flow providing, however, that its internal impedance is negligible, which is difficult to achieve in practice.

SUMMARY OF THE INVENTION

One aim of the invention is to provide means which allow the high frequency transistor amplifier to operate under pulsed operating conditions without presenting the drawbacks which have been mentioned above.

The invention is thus characterized in that it comprises means for supplying the supply currents to the transistor of the amplifier from the beginning of the input pulse by reducing the time constant for bringing it into conduction and the time required for reaching saturation, these means which restore the energy of the transistor being placed as close as possible thereto and minimizing the effect of the series inductances. The effect of the series inductances tends to be naturally opposed to the passage of the current, but the means of the invention are such that they do not cause any short-circuit of the high frequency component.

According to a preferred embodiment of the invention, these means are formed by a capacitor capable of storing the energy during the rest periods and restoring it at the beginning of the input pulse with a time constant as much reduced as possible.

BRIEF DESCRIPTION OF THE DRAWINGS

Other advantages and features of the invention will appear during the following description of one embodiment given with reference, apart from FIGS. 1 to 5 which refer to the prior art, to FIGS. 6, 7, 8, 9 and 10 which represent:

FIG. 6, the different possible connections of capacitor C to the terminals of a transistor;

FIG. 7, the variations of the S coefficients of the transistor in the circuit of the invention;

FIG. 8, the envelope curve of the HF output pulses in the circuit of the invention;

FIG. 9, the trend of the output pulses for two values of capacitor C; and

FIG. 10, the connection of the capacitive means for an amplifier with two push-pull transistors.

DESCRIPTION OF THE PREFERRED EMBODIMENTS

As is clear from the introduction to the present description, the aim of the invention is to define the means for using, under proper conditions, a transistor amplifier operating with ultra high frequency pulses and with high power under transitory operating conditions. These means, as was mentioned above, must be capable of supplying to the amplifier transistor a supply current as soon as the input pulse has been applied thereto, so that the time constant for bringing the transistor into conduction is reduced and saturation is reached as rapidly as possible.

These means are, as was mentioned, preferably formed by a capacitor storing the energy during the rest periods of the transistor and restoring it from the beginning of the conduction period triggered by a input pulse; the time constant of this capacitor must then be as low as possible when it discharges. The position of this capacitor assumes a certain importance, for it is necessary, as has been seen, that the effect of the series inductances Lc-Le is reduced as much as possible so that they cannot provide a great opposition to passage of the current, although they must in no case short-circuit the high frequency components.

FIGS. 6, which are only partially similar to FIG. 1, show possible positions for the capacitor C, so that it provides the conditions allowing the transistor amplifier to be usable and used under transitory operating conditions.

According to FIG. 6a, the capacitor C is connected between the connection point of the input impedance Le and the common point between the inductance Lc of the collector and the decoupling capacitor C3. The positioning of this capacitor C is relatively easy, it reduces the effect of the inductance of the emitter Le and eliminates the collector inductance; the condition of the transistor is speeded up.

According to FIG. 6b, the capacitor C is connected between ground M and the common point between the inductance Lc of the collector and the decoupling capacitor C3. The positioning of this capacitor C is easy; brought close to the collector of the transistor, this capacitor results in reducing the influence of the series inductance L, it does not however act on the conduction speed of the transistor.

According to FIG. 6c, the capacitor C is connected between the connection point E of the input inductance Le and the common point A between capacitors C3 and C4. The effects of this position are not as good as those obtained with the position shown in FIG. 6b for there is more series inductance and the positioning is relatively difficult.

According to FIG. 6d, capacitor C is connected between ground M and point A. Mounting thereof is relatively easy to achieve but the effects of the series inductances are not very much reduced.

According to FIG. 6e, capacitor C is placed directly at the terminals of the transistor between the emitter and the collector and as close as possible thereto, i.e. with the shortest possible connections. This position is certainly the best possible, however positioning thereof is difficult.

In so far as the operation of the circuit with capacitor C coupled according to the representations of FIG. 6, the following should be noted: under normal operation, a transistor is enabled by its emitter-base junction being caused to conduct at the moment when the input voltage appears. This conduction then causes enabling of the base-collector junction and causes the current to flow in the collector-emitter space. The fact that this conduction takes place in two phases explains the delays noted in the circuits of the prior art.

These prejudicial delays, as has been pointed out, must be eliminated or at least very much reduced by the circuit of the invention.

In fact, the presence of a capacitor C between emitter and collector, which presence is advocated by the invention, results in applying the enabling control voltage of the transistor simultaneously to the two junctions and so in enabling the two junctions simultaneously. This capacitor C thus speeds up the conduction of the transistor.

Moreover, this capacitor is charged at the supply voltage +VCC during the non conducting periods of the transistor. During the accelerated enabling, as has been explained, this capacitor instantaneously supplies current which flows in the emitter-collector space which has been enabled. It is then evident that, through the presence of the capacitor C, the operating point is reached much more rapidly than with the circuits of the prior art.

FIGS. 7a to 7d shows variation curves of the S parameters which have been defined above.

It is clear that the effects noted, with the circuit of the invention, are markedly improved with respect to those noted in relation to FIG. 4. For example, in FIG. 7a, it can be seen that the enabling time $\Delta t$ of the transistor is very much reduced, i.e. that the reflection coefficient at the input passes from the value 1 for which the transistor is disabled to a low value in a few nanoseconds whereas the gain, FIG. 7c, reaches its maximum value after about 50 nanoseconds, without any dead time Am, whereas in the prior art, it only reached it in 300 nanoseconds (FIG. 4c). The improvement noted for the circuit of the invention is appreciable being in a ratio of more than 4. This speed in the enabling of the transistor can also be seen in the curve of FIG. 7d.

In FIG. 7b, showing the parameter S12, transmission coefficient from the output to the input of the transistor, it can be seen that it is very low.

The value of capacitor C, for the results obtained to be considered as good, is between 0.1 and 5 μF.

FIG. 8 shows the envelope curve of the HF output pulses of the transistor for different capacitor values, i.e. the power P as a function of time. Curves 1, 2 and 3 have a common part, as far as point Q where the input power is applied. Curve 1, given when there is no capacitor at the terminals of the transistor, denotes a slow power rise with respect to curve 2 where the power rise is more rapid at the outset, but then slows down, this phenomenon being due to the fact that the capacitor has an insufficient value of the order of 0.1 μF for example; curve 3, obtained for a value of capacitor C of the order of 4.7 μF, is close to the ideal. Rapid rise of the power up to the maximum.

FIG. 9 shows the trend of the output pulses, curve 1 for a capacitor of 4.7 μF and curve 2 for a capacitor of 1 μF. The output pulse 1 is more rapidly established than pulse 2 and its value remains constant during the whole duration of its existence.

FIG. 10a shows the connection of the capacitor, in accordance with the invention for an amplifier with two push-pull transistors. In general, the two transistors T1 and T2 are not enabled at the same time. The proposed circuit which consists in coupling each of the capacitors C1 and C2 between an emitter and a collector, but here for capacitor C1 the emitter of a transistor T1 for example and the collector of transistor T2, and reciprocally for capacitor C2, allows the slow transistor to be enabled by the faster transistor.

FIG. 10b shows another embodiment for an amplifier with two push-pull transistors. The capacitors $C_1$ and $C_2$ are connected directly in parallel with the transistors $T_1$ and $T_2$, respectively.

In the description of the invention, the case of a common base connected transistor has been taken. The teaching of the invention is also obtained with a common emitter or collector connected transistor. The capacitor C used is of the same type as that described in what has gone before and must have a very small time constant, and its value is of the same order of size as that described. It must not be chemical. In a common emitter or collector transistor circuit, this capacitor is connected between base and collector or base and emitter. The circuit described is however a preferred circuit for high power transistors are provided to be used with the base to ground, the internal capacities of the transistor being then smaller.

Thus a transistor amplifier has been described operating at ultra high frequency under pulsed operating conditions.

What is claimed is:

1. A transistor microwave amplifier operating under pulse operating conditions comprises:
    at least one transistor connected with base to ground and receiving input pulses;
    an input inductance placed in parallel across the base and connected to the emitter of said at least one transistor;
    a collector inductance connected to the collector of said at least one transistor;
    a voltage supply source applying a current to the collector of said at least one transistor through said collector inductance;
    a capacitor connected in parallel across said source;
    a decoupling capacitor connected between said source and said collector inductance;
    a capacitor connected between the emitter and the collector of said at least one transistor, supplied by said source and intended to store the energy during the test periods of said at least one transistor and to restore it at the beginning of each input pulse, said capacitor connected between said emiter and collector of said at least one transistor having a short time constant in order to reduce the effects of the input and collector inductances.

2. An amplifier as claimed in claim 1, wherein:
    said transistor is connected with common emitter and said capacitor is connected between the collector and the base of said transistor.

3. An amplifier as claimed in claim 1, wherein said transistor is connected with common collector and said capacitor is placed between the emitter and the base of said transistor.

4. An amplifier as claimed in claim 1 wherein said capacitor has a value between 0.1 and 5 μF.

5. A transistor microwave amplifier operating under pulse operating conditions, comprising:
    at least two push-pull connected transistors;
    at least two emitter inductances each one of said emitter inductances being connected to the emitter of a corresponding one of said transistors;
    at least two collector inductances each one of said collector inductances being connected to the collector of a corresponding one of said transistors; and
    at least two capacitors each one of said capacitors being connected between the emitter of one of said transistors and the collector of another of said transistors, said capacitors being provided to speed up the enablement of said transistors.

6. A transistor microwave amplifier operating under pulse operating conditions, comprising:
    at least two push-pull connected transistors;
    at least two emitter inductances each one of said emitter inductances being connected to the emitter of a corresponding one of said transistors;
    at least two collector inductances each one of said collector inductances being connected to the collector of a corresponding one of said transistors; and
    at least two capacitors each one of said capacitors being connected between the emitter and collector of a corresponding one of said transistors, said capacitors being provided to speed up the enablement of said transistors.

* * * * *